United States Patent
Hsiao et al.

(10) Patent No.: US 7,875,793 B2
(45) Date of Patent: *Jan. 25, 2011

(54) SOLAR CELL ASSEMBLY

(75) Inventors: Bor-Yuan Hsiao, Taipei Hsien (TW); Wen-Ssu Chiu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 144 days.

This patent is subject to a terminal disclaimer.

(21) Appl. No.: 12/138,278

(22) Filed: Jun. 12, 2008

(65) Prior Publication Data
US 2009/0095340 A1    Apr. 16, 2009

(30) Foreign Application Priority Data
Oct. 16, 2007  (CN)  .................. 2007 1 0202080

(51) Int. Cl.
*H01L 31/042*  (2006.01)
*H01L 31/00*   (2006.01)
*F24J 2/00*    (2006.01)

(52) U.S. Cl. .................. 136/246; 136/259; 136/244; 250/214.1; 126/700

(58) Field of Classification Search .................. 136/246, 136/259, 244; 250/214.1; 126/700
See application file for complete search history.

(56) References Cited

U.S. PATENT DOCUMENTS

| 4,307,711 | A | * | 12/1981 | Doundoulakis | .............. 126/677 |
| 4,529,830 | A | * | 7/1985 | Daniel | .......................... 136/246 |
| 5,328,519 | A | * | 7/1994 | Kawakami | .................. 136/244 |
| 7,179,987 | B2 |   | 2/2007 | Fath et al. | |

* cited by examiner

*Primary Examiner*—Jeffrey T Barton
*Assistant Examiner*—Devina Pillay
(74) *Attorney, Agent, or Firm*—Andrew C. Cheng

(57) ABSTRACT

A solar cell assembly includes a first solar cell panel, a second solar cell panel, and at least one light guide assembly. The first solar cell panel has at least one first through hole defined therein. The second solar cell panel faces and is spaced from the first solar cell panel. The at least one light guide assembly comprises a light diverging lens engaged in the first through hole of the first solar cell panel, and a light guide body aligned with the light diverging lens and located between the first and second solar cell panels. The light diverging lens is configured for diverging sunlight incident thereupon and forming diverged light. The light guide body has an incident surface for receiving the diverged light, and emitting surfaces for emitting light to the second solar cell panel.

14 Claims, 4 Drawing Sheets

SOLAR CELL ASSEMBLY

BACKGROUND

1. Technical Field

The present invention relates to solar cell assemblies, and particularly, to a solar cell assembly with a plurality of solar cell panels.

2. Description of Related Art

Currently, various solar cell assemblies have been designed to receive and convert sunlight into electrical energy. Such solar cell assemblies have been applied on roofs of buildings and cars, or applied on portable electronic devices.

Solar cell panels are key components of the solar cell assemblies. A typical solar cell panel includes a P-type semiconductor layer and an N-type semiconductor layer. When sunlight projects on surfaces of the P-type semiconductor layer or the N-type semiconductor layer, a part of the sunlight is unavoidably reflected by the surfaces, and the other is absorbed. Photons in the absorbed sunlight collide with electrons in the P-type semiconductor layer or the N-type semiconductor layer, thereby, electron-hole pairs are generated, and thus an electric field is formed between the P-type semiconductor layer and the N-type semiconductor layer. In this way, the solar cell converts solar energy into electric power.

As known, the solar energy that the solar cell panel receives is limited by the surface area exposed to the sunlight. However, due to the limited outside surface areas, buildings, cars and portable electronic devices, having a large surface area for laying out a large solar cell panel or a plurality of solar cell panels is restricted.

What is needed, therefore, is a solar cell assembly which includes a plurality of solar cell panels and each of the solar cell panels can be efficiently used.

SUMMARY

An exemplary solar cell assembly includes a first solar cell panel, a second solar cell panel, and at least one light guide assembly. The first solar cell panel has at least one first through hole defined therein. The second solar cell panel faces and is spaced from the first solar cell panel. The at least one light guide assembly comprises a light diverging lens engaged in the first through hole of the first solar cell panel, and a light guide body aligned with the light diverging lens and located between the first and second solar cell panels. The light diverging lens is configured for diverging sunlight incident thereupon and forming diverged light. The light guide body has an incident surface for receiving the diverged light, and emitting surfaces for emitting light to the second solar cell panel.

Other advantages and novel features of the present invention will become more apparent from the following detailed description of preferred embodiment when taken in conjunction with the accompanying drawings.

BRIEF DESCRIPTION OF THE DRAWINGS

Many aspects of the solar cell assembly can be better understood with reference to the following drawings. The components in the drawings are not necessarily drawn to scale, the emphasis instead being placed upon clearly illustrating the principles of the present solar cell assembly. Moreover, in the drawings, like reference numerals designate corresponding parts throughout the several views.

DETAILED DESCRIPTION OF THE EMBODIMENTS

Embodiments of the present solar cell assembly will now be described in detail below and with reference to the drawings.

Figure 1:
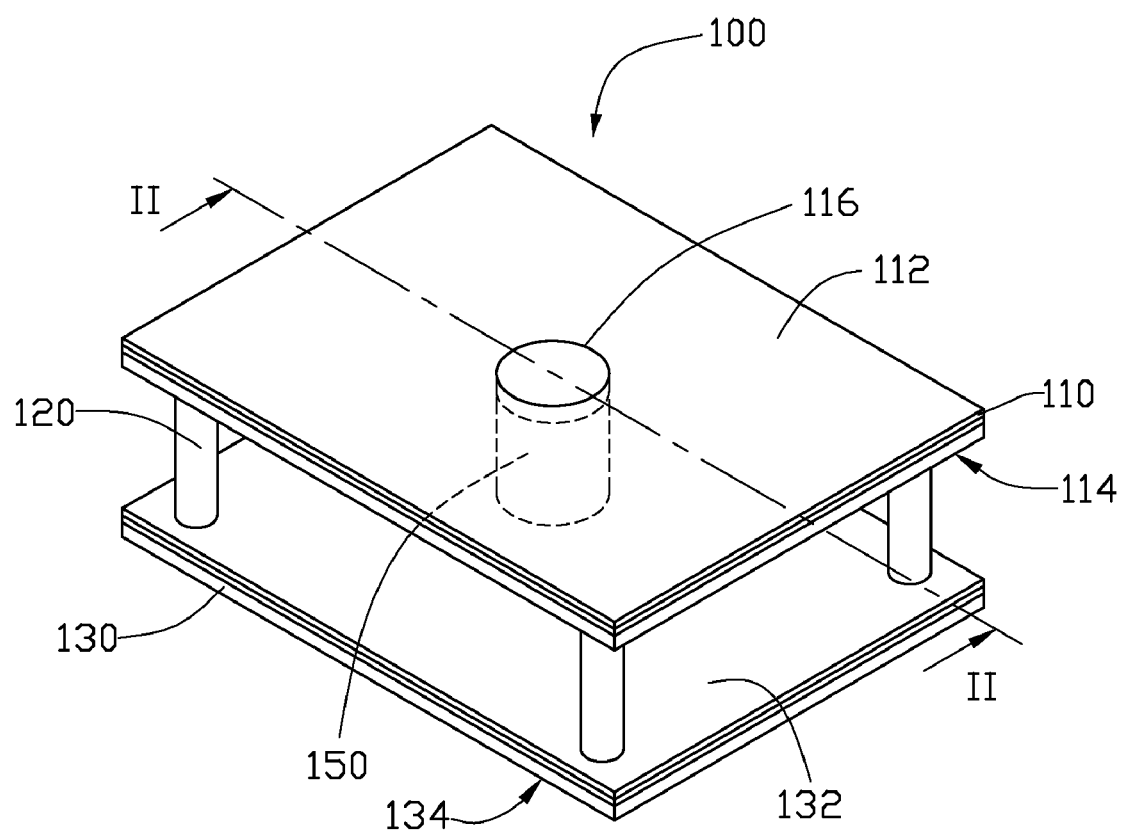
FIG. 1 is a schematic view of a solar cell assembly in accordance with a first embodiment of the present invention.
Figure 2:
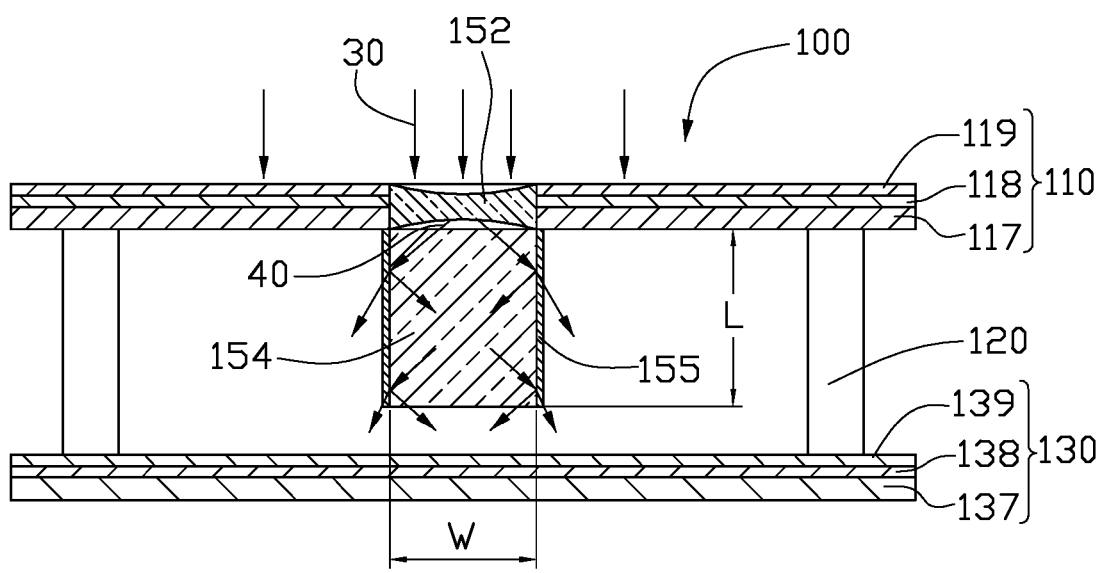
FIG. 2 is a cut-away view of the solar cell assembly taken along II-II line shown in FIG. 1.

Referring to FIGS. 1 and 2, an exemplary solar cell assembly 100 in accordance with a first embodiment, is shown. The solar cell assembly 100 includes a first solar cell panel 110, a second solar cell panel 130 facing the first solar cell panel 110, four spacers 120 to space apart the first and second solar cell panels 110, 130, and a first light guide assembly 150.

The first solar cell panel 110 has a light incident surface 112, a back surface 114 opposite to the light incident surface 112, and a first through hole 116 defined through the light incident surface 112 and back surface 114. The first solar cell panel 110 is comprised of a number of layers including at least a rigid substrate 117, a P-type semiconductor layer 118 and an N-type semiconductor layer 119. The rigid substrate 117 can be made from glass. The P-type semiconductor layer 118 can be made of aluminum gallium arsenide (AlGaAs), aluminum gallium nitride doped with hydrogen (AlGaN:H), or aluminum gallium nitride doped with magnesium (AlGaN:Mg). The N-type semiconductor layer 119 can be made of gallium nitride (GaN), or gallium nitride doped with silicon (GaN:Si). A thickness of the P-type semiconductor layer 118 is in a range from 1 to 10 microns. A thickness of the N-type semiconductor layer 119 is in a range from 0.5 to 10 microns.

The second solar cell panel 130 is aligned with the first solar cell panel 110. The second solar cell panel 130 has a light incident surface 132, a back surface 134 opposite to the light incident surface 132. The second solar cell panel 130 is comprised of a number of layers including at least a flexible substrate 137, a P-type semiconductor layer 138 and an N-type semiconductor layer 139. The flexible substrate 137 can be a stainless steel foil, with a thickness range from 10 to 100 microns. The P-type semiconductor layer 138 can be the same as the P-type semiconductor layer 118 of the first solar cell panel 110. The N-type semiconductor layer 139 can be the same as the N-type semiconductor layer 119 of the first solar cell panel 110.

A P-N junction layer (not shown) may be applied to each of the first and second solar cell panels 110, 130, between the respective P-type semiconductor layers 118, 138 and the N-type semiconductor layers 119, 139. The P-N junction layer may be made of copper indium gallium diselenide ($CuIn_{1-x}GaSe_2$). The P-N junction layer helps to improve photon-electron conversion efficiency of each of the first and second solar cell panels 110, 130.

The first and second solar cell panels 110, 130 each are in a rectangular shape. The four spacers 120 each are in a rod shape. The four spaces 120 are positioned between the first and second solar cell panels 110, 130 and adjacent to the respective four corners of the first and second solar cell panels 110, 130. An interspace is maintained between the adjacent spacers 120.

The first light guide assembly 150 includes a light diverging lens 152 and a light guide body 154. The light diverging lens 152 is engaged in the first through hole 116 of the first solar cell panel 110. The light diverging lens 152 can be a concave lens. The light guide body 154 is aligned with the light diverging lens 152 and attached on the back surface 114 of the first solar cell panel 110. The light guide body 154 is located between the first and second solar cell panels 110, 130. The light guide body 154 is made of polymethyl methacrylate, and is in a cylindrical shape. A length L of the light guide body 154 is larger than a width W thereof. The length L of the light guide body 154 can be designed according to a distance between the first and second solar cell panels 110, 130. A proximal end surface of the light guide body 154 adjacent to the light diverging lens 152 is light incident surface, and peripheral side surface and a distal end surface thereof are light emitting surfaces. Preferably, a transflective film 155 is formed on the peripheral side surface of the light guide body 154 for transmitting a first part of the light therethrough and reflecting a second part of the light therein.

In use, the solar cell assembly 100 can be applied on, for example, a roof of a building. Due to flexibility of the flexible substrate 137, the solar cell assembly 100 can easily conform to a shape of the roof and be attached thereon. Surface area of the first solar cell panel 110 and the light diverging lens 152 are fully and directly exposed to sunlight 30. A periphery surface area of the second solar cell panel 130 may be directly exposed to sunlight (not shown) incident from the interspace between the adjacent spacers 120, but, a central surface area of the second solar cell panel 130 cannot directly be exposed to sunlight. However, the light diverging lens 52 converts the sunlight 30 incident thereupon into a diverged light 40, then the light guide body 154 receives the diverged light 40, the light guide body 154 together with the transflective film 155 guides the diverged light 40 to the second solar cell panel 130, thereby, compensating the light exposure of the central surface area of the second solar cell panel 130. The transflective film 155 enhances light reflection and transmission in the light guide body 154. The first light guide assembly 150 is able to guide the sunlight 30 for a long distance. In this way, the entire second solar cell panel 130 is actually exposed to sunlight. The second solar cell panel 130 can then convert solar energy from such light into electric power.

Figure 3:
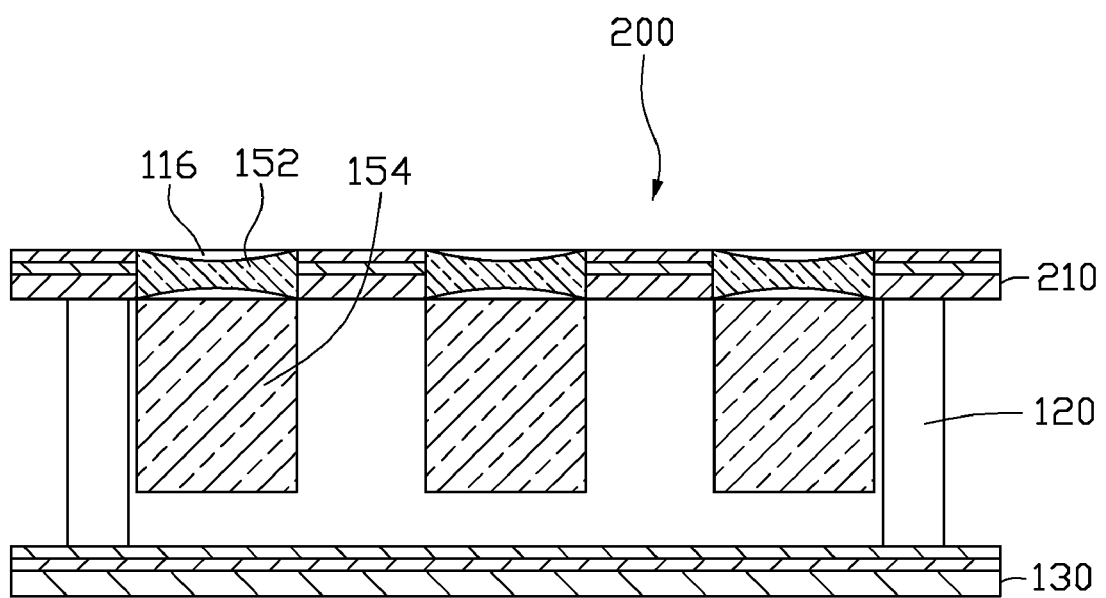
FIG. 3 is a cut-away view of the solar cell assembly in accordance with a second embodiment of the present invention.

Referring to FIG. 3, an exemplary solar cell assembly 200 in accordance with a second embodiment, is shown. The solar cell assembly 200 is essentially similar to the solar cell assembly 100 illustrated above, however, in the solar cell assembly 200, a first solar cell panel 210 with a number of first through holes 116 defined therein, is provided, and correspondingly, a number of light diverging lenses 152 and light guide bodies 154 are provided. The light diverging lenses 152 and the light guide bodies 154 are able to fully compensate the light exposure of the second solar cell panel 130. In this way, surface areas of the first and the second solar cell panels 110, 130 in the solar cell assembly 200 can be designed to be more larger.

Figure 4:
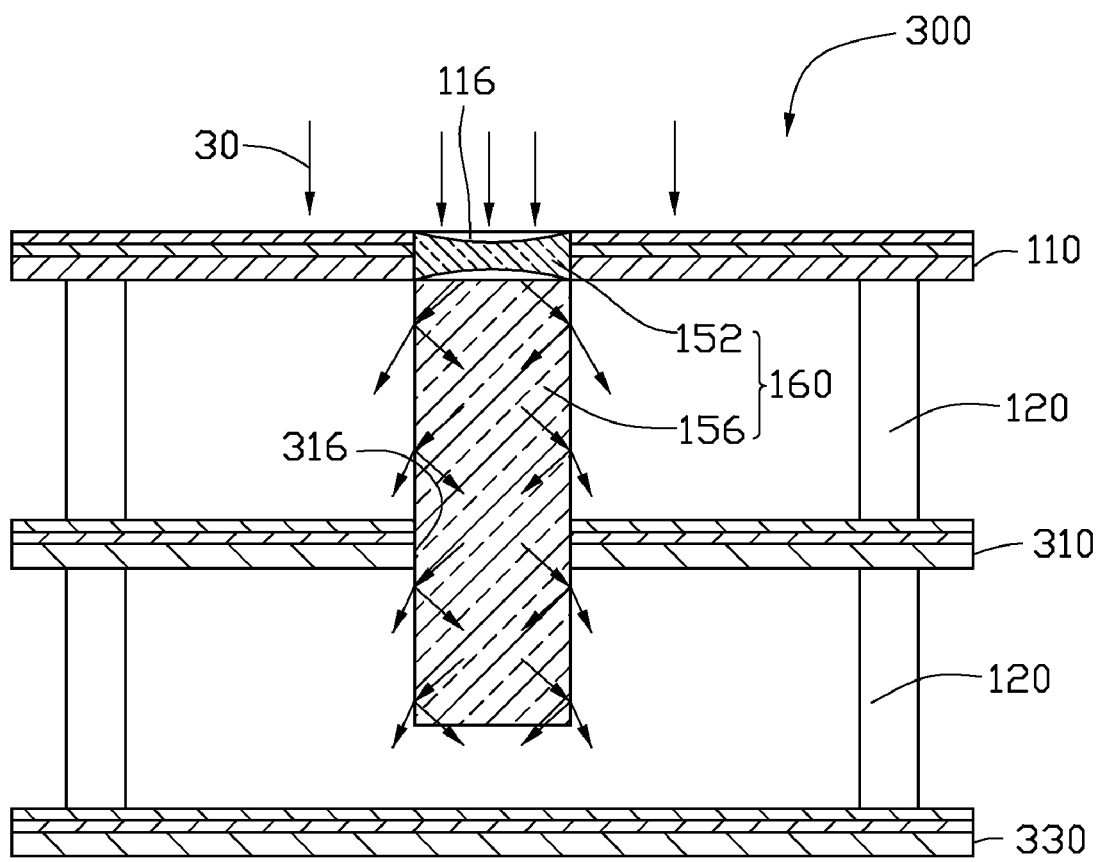
FIG. 4 is a cut-away view of the solar cell assembly in accordance with a third embodiment of the present invention.

Referring to FIG. 4, an exemplary solar cell assembly 300 in accordance with a third embodiment, is shown. The solar cell assembly 300 includes a first solar cell panel 110, a second solar cell panel 310 disposed under the first solar cell panel 110, a third solar cell panel 330 disposed under the second solar cell panel 310, a number of spacers 120, and a second light guide assembly 160. A substrate of each of the first and second solar cell panels 110, 310 is rigid, and a substrate of the third solar cell panel 330 is flexible. The second light guide assembly 160 includes a light diverging lens 152 and an elongated light guide body 156.

The first solar cell panel 110 has a first through hole 116 defined therein. The second solar cell panel 310 has a second through hole 316 defined therein. The second through hole 316 is aligned with the first through hole 116. The spacers 28 are arranged between the first solar cell panel 110 and the second solar cell panel 310, and between the second solar cell panel 310 and the third solar cell panel 330. The light diverging lens 152 is embedded in the first through hole 116 of the first solar cell panel 110. The elongated light guide body 156 passes through the second through hole 316 of the second solar cell panel 310. The second light guide assembly 160 is able to guide the sunlight 30 to the second and third solar cell panels 310, 330.

It is understood that the above-described embodiments are intended to illustrate rather than limit the invention. Variations may be made to the embodiments and methods without departing from the spirit of the invention. Accordingly, it is appropriate that the appended claims be construed broadly and in a manner consistent with the scope of the invention.

What is claimed is:

1. A solar cell assembly, comprising:
a first solar cell panel having at least one first through hole defined therein;
a second solar cell panel facing and spaced from the first solar cell panel; and
at least one light guide assembly comprising a light diverging lens engaged in the first through hole of the first solar cell panel, and a light guide body aligned with the light diverging lens and located between the first and second solar cell panels, the light diverging lens being configured for diverging sunlight incident thereupon and forming diverged light, the light guide body being made of polymethyl methacrylate and having a cylindrical shape, the light guide body having an incident surface located on an end surface thereof adjacent to the light diverging lens and configured for receiving the diverged light from the light diverging lens, and emitting surfaces for emitting light to the second solar cell panel wherein there are a plurality of spacers spacing the first and second solar panels, and wherein the first solar cell panel and the light diverging lens are configured for being directly and entirely exposed to sunlight.

2. The solar cell assembly as described in claim 1, wherein an interspace is maintained between the adjacent spacers, the second solar cell panel having a peripheral portion configured for being directly exposed to sunlight incident through the interspace, and a central portion configured for receiving the light from the emitting surfaces of the light guide body.

3. The solar cell assembly as described in claim 1, wherein the first solar cell panel comprises a rigid substrate.

4. The solar cell assembly as described in claim 1, wherein the second solar cell panel comprises a flexible substrate.

5. The solar cell assembly as described in claim 4, wherein the flexible substrate is a stainless steel foil.

6. The solar cell assembly as described in claim 1, wherein the light diverging lens is a concave lens.

7. The solar cell assembly as described in claim 1, wherein the emitting surfaces comprise a peripheral side surface of the light guide body and a distal end surface of the light guide body, the distal end surface facing the second solar cell panel.

8. The solar cell assembly as described in claim 1, wherein a transflective film is formed on the peripheral side surface of the light guide body for transmitting a first part of the light therethrough and reflecting a second part of the light.

9. The solar cell assembly as described in claim 1, further comprising a third solar cell panel facing to and spaced apart from the second solar cell panel, the second solar cell panel having a second through hole defined therein, the light guide body being an elongated body, the light guide body passing through the second through hole and being configured for receiving and guiding the diverged light to the second and third solar cell panels.

10. The solar cell assembly as described in claim 9, wherein the first and second solar cell panels each comprise a rigid substrate.

11. The solar cell assembly as described in claim 9, wherein the third solar cell panel comprises a flexible substrate.

12. A solar cell assembly, comprising:
- a first solar cell panel having at least one first through hole defined therein, the first solar cell panel configured for being directly and entirely exposed to sunlight;
- a second solar cell panel facing and spaced from the first solar cell panel, the second solar cell panel having a peripheral portion configured for directly exposed to sunlight and a central portion; and
- at least one light guide assembly comprising a light diverging lens engaged in the at least one first through hole, and a light guide body aligned with the light diverging lens and located between the first and second solar cell panels, the light diverging lens being configured for diverging sunlight incident thereupon and forming diverged light, the light guide body having a cylindrical shape, the light guide body having an incident surface located on an end surface thereof adjacent to the light diverging lens and configured for receiving the diverged light from the light diverging lens, and emitting surfaces for emitting light to a central portion of the second solar cell panel.

13. The solar cell assembly as described in claim 12, wherein the light diverging lens is configured for being directly exposed to sunlight.

14. The solar cell assembly as described in claim 12, further comprising a third solar cell panel facing to and spaced apart from the second solar cell panel, the second solar cell panel having a second through hole defined therein, the light guide body passing through the second through hole and being configured for receiving and guiding the diverged light to the second and third solar cell panels.

* * * * *